(12) United States Patent
Tsujita et al.

(10) Patent No.: US 9,406,510 B2
(45) Date of Patent: Aug. 2, 2016

(54) PATTERN FORMING METHOD AND ARTICLE MANUFACTURING METHOD

(71) Applicant: CANON KABUSHIKI KAISHA, Tokyo (JP)

(72) Inventors: Kouichirou Tsujita, Utsunomiya (JP); Yuichi Gyoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/147,679

(22) Filed: Jan. 6, 2014

(65) Prior Publication Data

US 2014/0199843 A1 Jul. 17, 2014

(30) Foreign Application Priority Data

Jan. 11, 2013 (JP) .................................. 2013-003292

(51) Int. Cl.
*H01L 21/311* (2006.01)
*H01L 21/033* (2006.01)
*H01L 21/768* (2006.01)

(52) U.S. Cl.
CPC ...... *H01L 21/0337* (2013.01); *H01L 21/31144* (2013.01); *H01L 21/76816* (2013.01)

(58) Field of Classification Search
USPC .......................................... 430/324, 323, 326
See application file for complete search history.

(56) References Cited

U.S. PATENT DOCUMENTS

| 7,989,145 B2 * | 8/2011 | Lee et al. ....................... 430/313 |
| 2013/0087529 A1 * | 4/2013 | Hatakeyama et al. .......... 216/47 |
| 2014/0045125 A1 * | 2/2014 | Tran .............................. 430/319 |

OTHER PUBLICATIONS

Smayling, et al., "32 nm and below Logic Patterning using Optimized Illumination and Double Patterning", Proc. of SPIE, vol. 7274, pp. 72740K-1-72740K-8, 2009.

* cited by examiner

*Primary Examiner* — Daborah Chacko Davis
(74) *Attorney, Agent, or Firm* — Carter, DeLuca, Farrell & Schmidt, LLP (57) ABSTRACT

Provided is a method for forming a pattern on a layer on a substrate. The method includes forming a line-and-space pattern on the layer; coating a resist on the line-and-space pattern and filling the resist in a space portion of the line-and-space pattern; exposing a pattern to the resist, developing the exposed resist, and forming a resist pattern on the space portion; and forming a pattern on the layer using a pattern which is a combination of a line portion of the line-and-space pattern and the resist pattern as a mask.

9 Claims, 11 Drawing Sheets

FIG. 2

Cu FILM

PATTERN FORMING METHOD AND ARTICLE MANUFACTURING METHOD

BACKGROUND OF THE INVENTION

1. Field of the Invention

The present invention relates to a pattern forming method and an article manufacturing method.

2. Description of the Related Art

Figure 14:
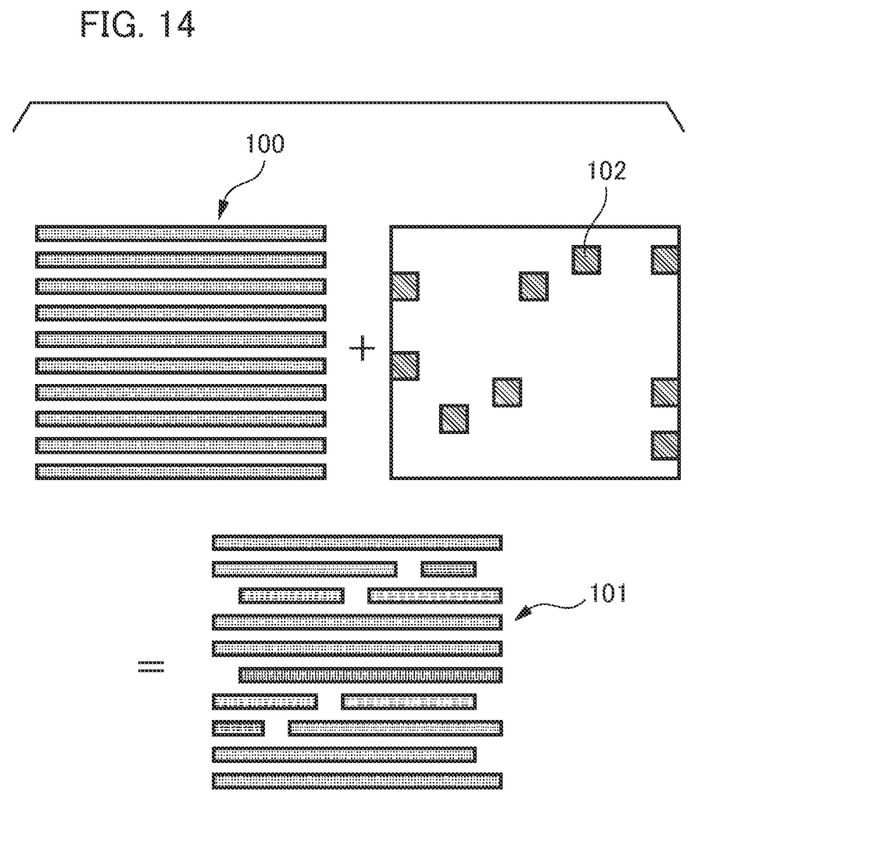
FIG. 14 is a diagram illustrating pattern formation using the 1D layout.

With an increase in miniaturization of semiconductor devices as articles, the fidelity of transferring a design pattern on a wafer has been reducing year by year, resulting in difficulty in coping with such a circumstance using previous two-dimensional shape pattern formation. In order to cope with such a circumstance, the 1D layout for constituting a design pattern only by using a linear pattern extending in one direction is employed. There is a technical document describing a pattern forming method according to the 1D layout (M. Smayling, and V. Axelrad "32 nm and below Logic Patterning using Optimized Illumination and Double Patterning", Proc. of SPIE, Vol. 7274, 72740K-1-72740K-3, 2009.). FIG. 14 is a schematic plan view illustrating the shapes of an L/S (line-and-space) pattern 100 and a cut pattern (resist pattern) 102 which are formed by the pattern forming method according to the 1D layout. According to the pattern forming method, the L/S pattern 100 is firstly formed on the entire chip. Then, a pattern 101 in which the L/S pattern 100 is combined with the resist pattern 102 can be formed in the underlying layer such that some of space portions are cut by using a plurality of resist patterns 102.

A lithography apparatus represented by an exposure apparatus is used for forming such a pattern. The exposure apparatus is an apparatus that transfers a pattern of an original (reticle, mask, or the like) onto a photosensitive substrate (e.g., wafer or the like where the surface thereof is coated with a resist layer) via a projection optical system in a lithography process included in manufacturing steps for a semiconductor device, a liquid crystal display device, and the like. Upon forming an L/S pattern, the exposure apparatus transfers an image of a pattern formed on an original onto a wafer in a resolvable range. In particular, in the current exposure apparatus, given that a process coefficient is 0.25, a wavelength of ArF laser as the light source is 193 nm, and a maximum NA (numerical aperture) is 1.35, the limit resolution of the L/S pattern is 36 nm L/S, i.e., the product of 0.25 and (193/1.35). However, a size equal to or less than 30 nm L/S is required in order to cope with the manufacture of current front-line devices. Accordingly, for example, a pattern forming method including a step of forming a side wall consisting of an oxide film and a step of removing the side wall has been employed in order to form an L/S pattern finer than 36 nm L/S in recent years.

The aforementioned pattern forming method utilizing a side wall may be mainly applied to a gate step and a metal step in the device manufacturing steps. Among them, in the metal step of the conventional pattern forming method, the cut pattern 101 is a remaining pattern. Here, the 1D layout may be regularly employed in 20 nm node or further beyond. For example, the pattern size in 16 nm node is 32×50 nm. At this time, the thickness of the resist film is set in the range of from 50 to 100 nm. However, in this state, the depth of the pattern to the line width of the pattern (the pattern aspect ratio) exceeds 1 and the installation area (formation area) is narrower than the conventional pattern, so that the already-formed resist pattern may be peeled off upon development.

SUMMARY OF THE INVENTION

The present invention provides, for example, a pattern forming method that is advantageous to suppression of peel-off of the resist pattern upon forming a pattern using the 1D layout.

According to an aspect of the present invention, a method for forming a pattern on a layer on a substrate is provided that includes forming a line-and-space pattern on the layer; coating a resist on the line-and-space pattern and filling the resist in a space portion of the line-and-space pattern; exposing a pattern to the resist, developing the exposed resist, and forming a resist pattern on the space portion; and forming a pattern on the layer using a pattern which is a combination of a line portion of the line-and-space pattern and the resist pattern as a mask.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

Firstly, a description will be given of the forming steps in the pattern forming method according to one embodiment of the present invention in a time-series manner. Here, the pattern forming method according to the present embodiment is used for manufacturing articles such as semiconductor devices. The pattern forming method employs so-called 1D layout and particularly includes a side wall (SW: to be described in detail below) forming step and a side wall removing step in the pattern forming steps. The pattern forming method is used for patterning less than 72 nm which is the sum (pitch) of L/S (line-and-space) formed at the size of NA of 1.35 which is the current limitation of the light exposure technology (lithography process). More specifically, in view of the typical case where the line width L is often set to be equal to the space width S, the pattern forming method is used in fine pattern dimension where one side of the resist pattern determined by the space width S is equal to or less than 36 nm. Hereinafter, a description will be given by taking an example of forming a specific pattern having L/S of 20/20 nm. It should be noted that the line-and-space pattern (L/S pattern) according to the present embodiment is a pattern in which a plurality of linear lines (line portions) is arranged side by side. The shape of the line (the shape with respect to the extended plane) may be a linear, a curve, a line of successive segments tilted at a constant angle, or the like.

FIGS. 1A to 1D are schematic cross-sectional views illustrating steps performed until SW formation is completed in a time-series manner in the pattern forming method according to the present embodiment. Here, the 1D layout may be applied to a gate step and a metal step. In the present embodiment, the 1D layout is particularly applied to the metal step. An exemplary metal material used in the metal step includes Cu. In this case, the difficulty in etching a Cu layer is high, and thus, the Cu layer is typically formed in a process called Damascene. In the process, grooves are formed in an interlayer film and then Cu is embedded by plating in the grooves. After that, Cu formed on the top surface of the inter layer film is removed by CMP (chemical-mechanical polishing). FIG. 2 is a schematic plan view illustrating a final state after Cu is embedded in the grooves formed by the process. Since multiple layers are typically formed in the metal step, such a process is repeated. Hereinafter, as shown in FIGS. 1A to 1D, a description will be given by taking an example of a structure in which an interlayer film 2 is formed on an underlying layer 1 formed on a substrate and a barrier film 3 is further formed on the interlayer film 2. Among them, the underlying layer 1 is a layer formed in the previous step of the metal step or a layer formed in the earlier metal step. The interlayer film 2 is a film (layer) which is used for forming a Cu wire in the Damascene process and is formed of, for example, an oxide film. The barrier film 3 is a film (layer) which is used for eliminating mutual influence between the upper layer and the lower layer thereof when a Damascene process is performed. An exemplary material used for she barrier film 3 includes SiON, SiC, or the like.

Figure 1A:
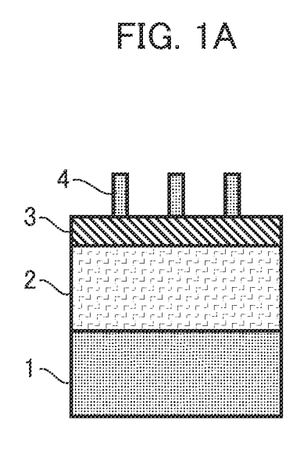
FIG. 1A is a diagram illustrating a step among the forming steps until SW formation is completed according to one embodiment of the present invention.
Figure 1B:
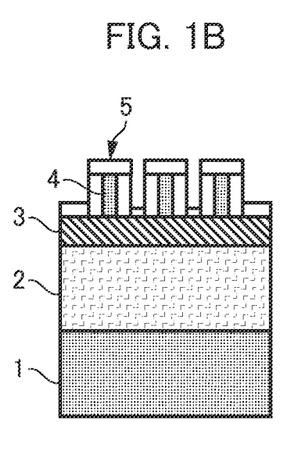
FIG. 1B is a diagram illustrating a step among the forming steps until SW formation is completed according to one embodiment of the present invention.
Figure 1C:
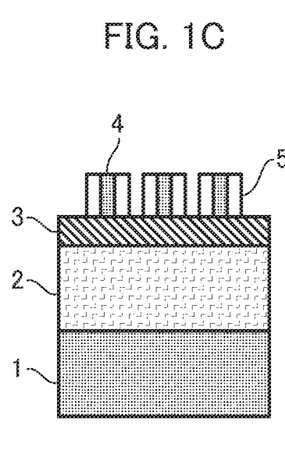
FIG. 1C is a diagram illustrating a step among the forming steps until SW formation is completed according to one embodiment of the present invention.
Figure 1D:
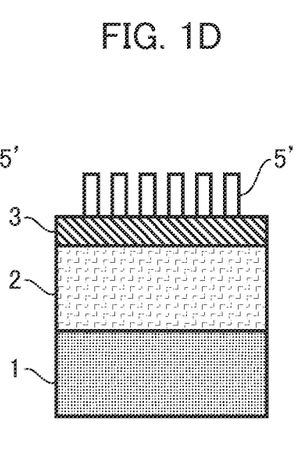
FIG. 1D is a diagram illustrating a step among the forming steps until SW formation is completed according to one embodiment of the present invention.
Figure 2:
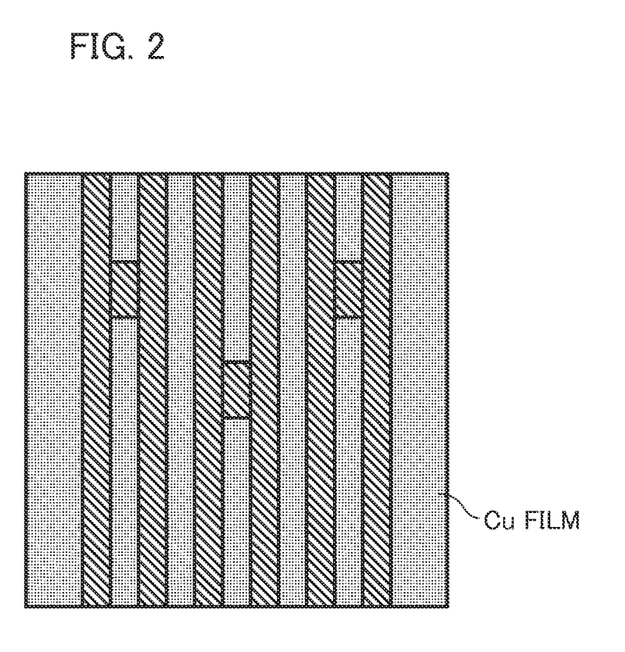
FIG. 2 is a diagram illustrating a state after a Cu layer is formed.

Firstly, as shown in FIG. 1A, a resist pattern (resist 4) having L/S of 20/60 nm, which is greater than she limit resolution, is formed on the barrier film 3 (on she layer) using an exposure apparatus (lithography apparatus) or the like. The difficulty of the lithography for resist pattern formation having the L/S of 20/60 nm is higher than that having the same pitch with L/S of 40/40 nm. Thus, for example, after forming a resist pattern having L/S of 40 nm, the resist 4 is subject to isotropic etching using oxygen plasma or the like so as to achieve a resist pattern having L/S of 20/60 nm. Next, as shown in FIG. 1B, an oxide film 5 is formed on the barrier film 3 (also including the resist 4), on which a resist pattern is formed, using spin coating, CVD, sputtering, or the like. At this time, a portion (SW 5') of the oxide film 5 which is formed on the side surfaces of the resist 4 is referred to as a "side wall". Since the oxide film 5 is deposited by isotropic deposition, the width of the SW 5' is equal to the film thickness of the oxide film 5 which is formed on the top surface of the resist 4. In other words, the width of the SW 5' is equal to the width L (here, 20 nm) of a line to be formed. While a film which is formed on the top surface of the barrier film 3 and the resist 4 is an oxide film, a carbide film (carbon layer), a nitride film, or the like may also be used. Next, as shown in FIG. 1C, the oxide film 5 is subject to anisotropic etching, and only the oxide film 5 in contact with the side surfaces of the resist 4 remains. Then, as shown in FIG. 1D, the resist 4 is removed by oxygen plasma. In this manner, the SW 5' (L/S pattern) having 20 nm L/S is formed (first step).

Figure 3A:
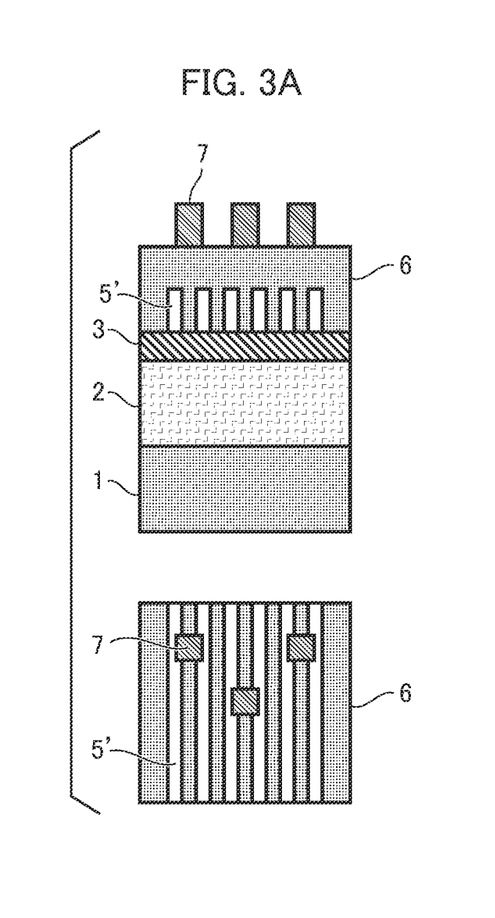
FIG. 3A is a diagram illustrating a step among the forming steps according to the conventional resist pattern forming method.
Figure 3B:
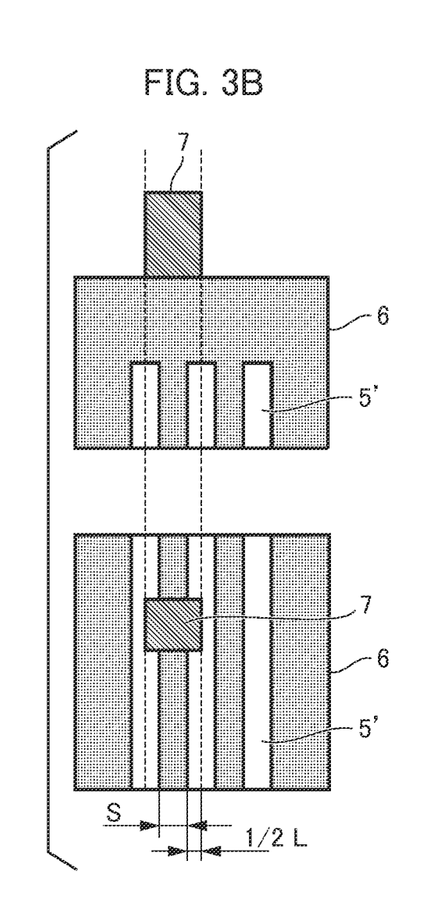
FIG. 3B is a partially enlarged view of FIG. 3A.
Figure 3C:
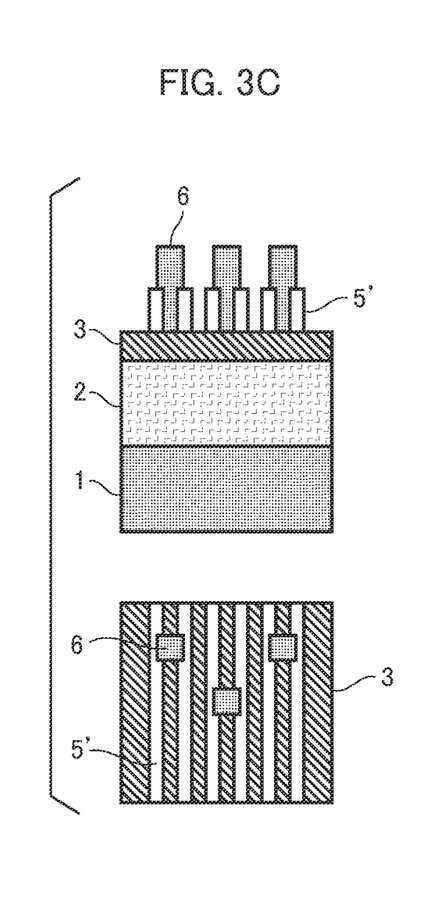
FIG. 3C is a diagram illustrating a step among the forming steps according to the conventional resist pattern forming method.

Next, a cut pattern for cutting some of the pattern corresponding to the space portion of the L/S pattern formed on the barrier film 3 is formed. Here, a description will be firstly given of the conventional resist pattern forming method for the purpose of comparison. FIGS. 3A to 3C are schematic cross-sectional view illustrating steps from a resist pattern forming step and a transferred cut pattern forming step prior to exposure to a resist anisotropic etching step in a time-series manner from among the steps in the conventional resist pattern forming method. In each of FIGS. 3A to 3C, the top view is a cross-sectional view and the bottom view is a plan view. In FIGS. 3A to 3C, the same reference numerals are retained to denote the same constituent parts as those shown in other drawings according to the present embodiment for ease of comparison. Firstly, as shown in FIG. 3A, after the SW 5' is formed through the step shown in FIG. 1D, a BARC (anti-reflective film) 6 is coated onto the surface of the SW 5', and then groove embedding and flattening of the surface of the BARC 6 are performed. Then, a resist is coated onto the surface of the BARC 6, a resist pattern (cut pattern) 7 is formed at a cutting position using a desired cutting-position pattern as a mask. As can be seen from FIG. 3A, the resist pattern 7 formed at this time is a remaining pattern. With reference to FIG. 3B which is a partially enlarged view of FIG. 3A, the dimension of the resist pattern 7 in a direction perpendicular to the SW 5' is the sum of the space width S and the width of one half of the widths L of the lines on both sides of the SW 5'. This is for the sake that the resist pattern 7 securely covers a predetermined space portion so as not to overlap the adjacent space portions even when an overlay error occurs to the dimension of patterning. Note that the dimension of the resist pattern 7 in the L/S direction of the SW 5' is kept to a desired width. Next, as shown in FIG. 3C, the BARC 6 is subject to anisotropic etching using the resist pattern 7 as a mask. Consequently, the SW 5' and the resist pattern 7 formed by patterning is formed on the barrier film 3. A pattern which is a combination of the SW 5' and the resist pattern 7 formed by patterning is used as an etching mask on the barrier film 3, so that a pattern (pattern at a hatched portion shown in FIG. 3C) in which lines are cut at some points is formed on the barrier film 3 or the interlayer film 2.

Here, in the conventional resist pattern forming method, the resist pattern 7 in the stage shown in FIG. 3A is a remaining pattern as described above. In this state, the resist pattern 7 may be peeled off upon development as mentioned in Description of the Related Art. Thus, in the present embodiment, the resist pattern 7 is suppressed from being peeled off by performing the following forming steps instead of the or steps described with reference to FIGS. 3A to 3C.

Figure 4A:
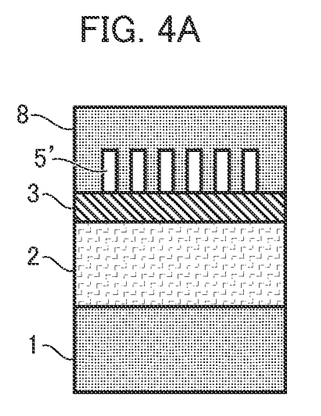
FIG. 4A is a diagram illustrating a step until a resist film is coated according to one embodiment.
Figure 4B:
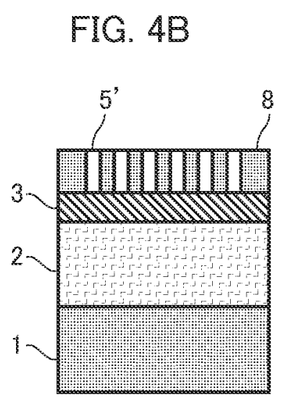
FIG. 4B is a diagram illustrating a step until the coated resist is flattened after the coating step shown in FIG. 4A.

FIGS. 4A and 4B are schematic cross-sectional views illustrating steps from a resist film coating step to a resist film flattening (etching-back treatment) step in a time-series manner in the resist pattern forming method according to the present embodiment. Firstly, as shown in FIG. 4A, after the SW 5' is formed through the step shown in FIG. 1D, the resist 8 instead of the BARC 6 is coated on the surface of the SW 5'. In this manner, the resist 8 is filled in the space portion of the SW 5' (second step). Next, as shown in FIG. 4B, the surface of the resist 8 is flattened, and the height of the resist 8 is adjusted such that the height of the resist 8 is approximately the same as that of the SW 5' (line portion) (flattening step). Here, when the resist 8 is a positive type, examples of a method for flattening the resist 8 include a method for developing the resist 8 after weak exposure is carried out in the entire surface thereof, a method for etching the resist 8 using oxygen plasma or the like, a method for applying CMP to the resist 8, and the like.

Figure 5A:
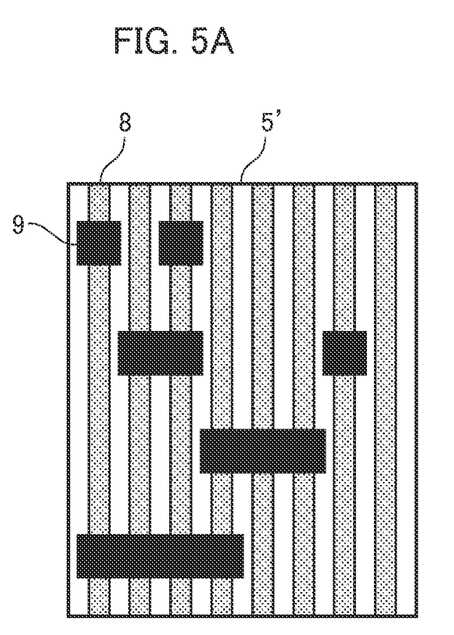
FIG. 5A is a diagram illustrating a state in which a mask pattern on which a light-shielding portion is formed is transferred.
Figure 5B:
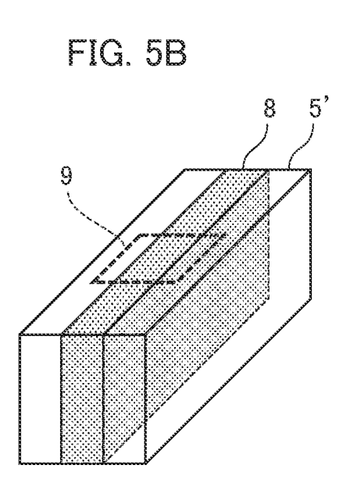
FIG. 5B is a diagram illustrating a pattern from among the patterns shown in FIG. 5A.

FIGS. 5A and 5B are schematic cross-sectional views illustrating a state in which a mask (reticle) pattern on which light-shielding portions are formed at cutting positions is transferred onto a substrate. As shown in FIG. 5A, a pattern 9 with a mask pattern projected thereon is exposed to the SW 5' and the resist 8, which are formed through the step shown in FIG. 4B, at positions at which some of linear space portions are cut using an exposure apparatus, so that a latent image is formed on the resist 8 (third step). FIG. 5B is a schematic perspective view focusing on one pattern 9 shown in FIG. 5A. The line width of the pattern is equal to or greater than the width of the space.

Figure 6A:
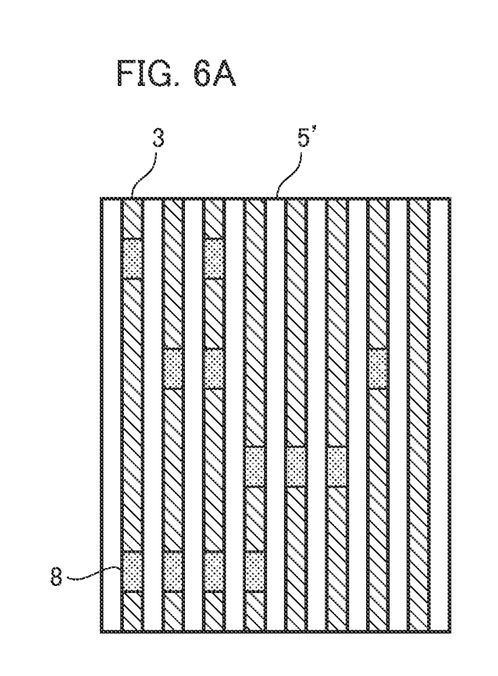
FIG. 6A is a diagram illustrating a state after development using the mask pattern shown in FIG. 5A as a mask.
Figure 6B:
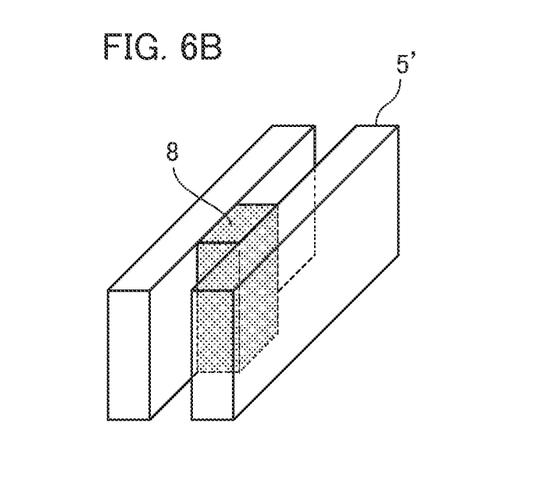
FIG. 6B is a diagram illustrating a pattern from among the patterns shown in FIG. 6A.

FIGS. 6A and 6B are schematic cross-sectional views illustrating a state after the exposed resist is developed. Note that FIG. 6A and FIG. 6B correspond to FIG. 5A and FIG. 5B, respectively. In the present embodiment, as shown in FIG. 6A, only the resist 8 at a space portion not overlapping the pattern 9 remains after development (fourth step). Thus, the resist pattern (the resist 8) remaining after exposure and development is supported in contact with the SWs 5' on both sides of the resist 8 as shown in FIG. 6B, resulting in reduction in the tendency of peeling off of the resist pattern remaining after development.

As described above, although the BARC 6 is employed in the conventional pattern forming method, no BARC is employed in the present embodiment. Here, a description will be given of the reason why no BARC is required in the present embodiment. Conventionally, the reason why the BARC 6 is used for pattern formation is to reduce reflection from the lower layer and to reduce surface irregularities of the resist upon exposure. More specifically, the former is to form a highly accurate resist pattern by reducing unnecessary reflected light and she latter is to reduce patterning defocus.

Figure 7:
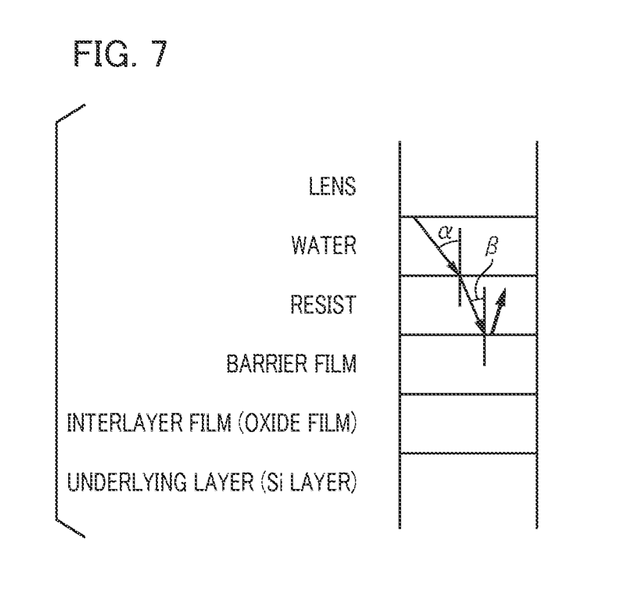
FIG. 7 is a diagram illustrating a structure to be applied for the calculation of reflectance.
Figure 8:
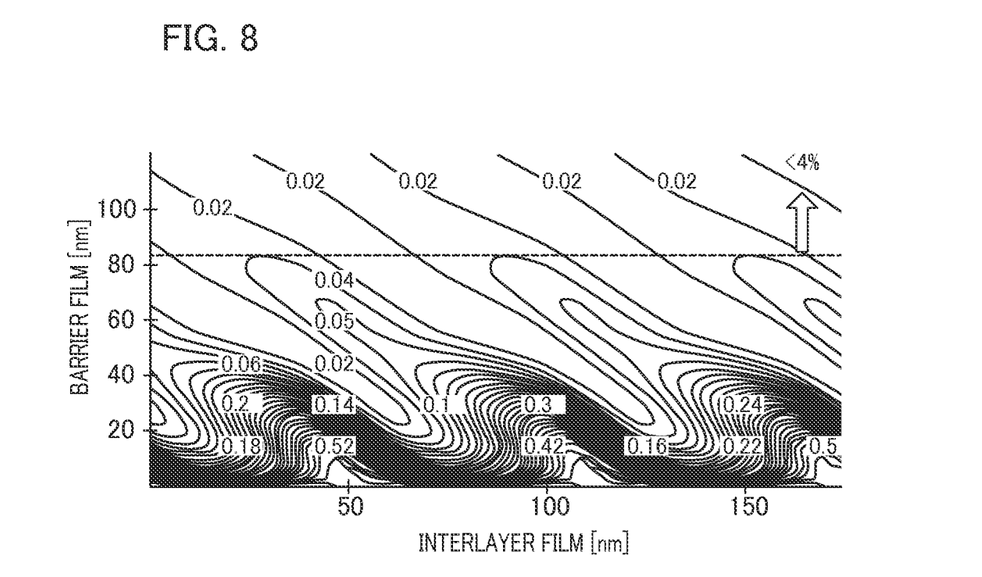
FIG. 8 is a contour map illustrating the calculation result of reflectance at the angle of incidence of 0°.
Figure 9A:
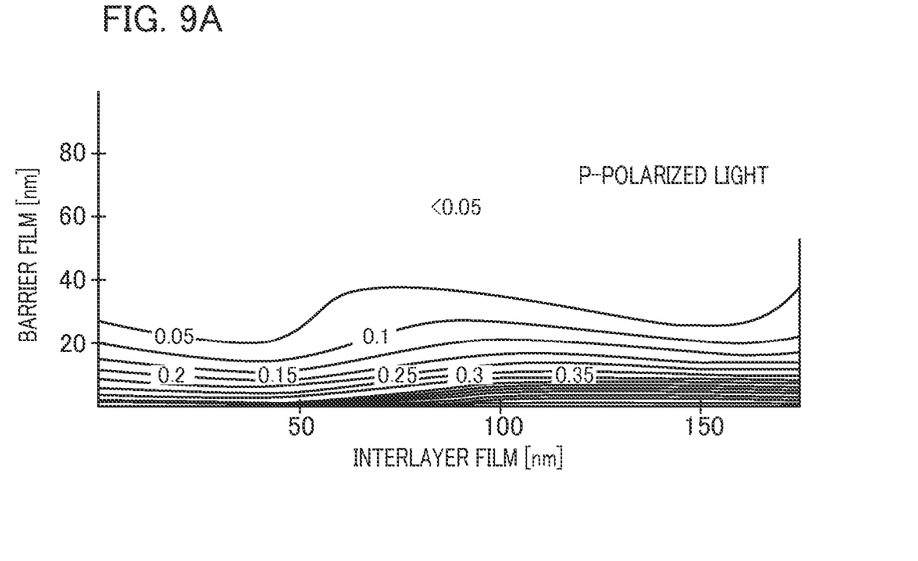
FIG. 9A is a contour map illustrating the calculation result of the reflectance of P-polarized light at the angle of incidence of 52°.
Figure 9B:
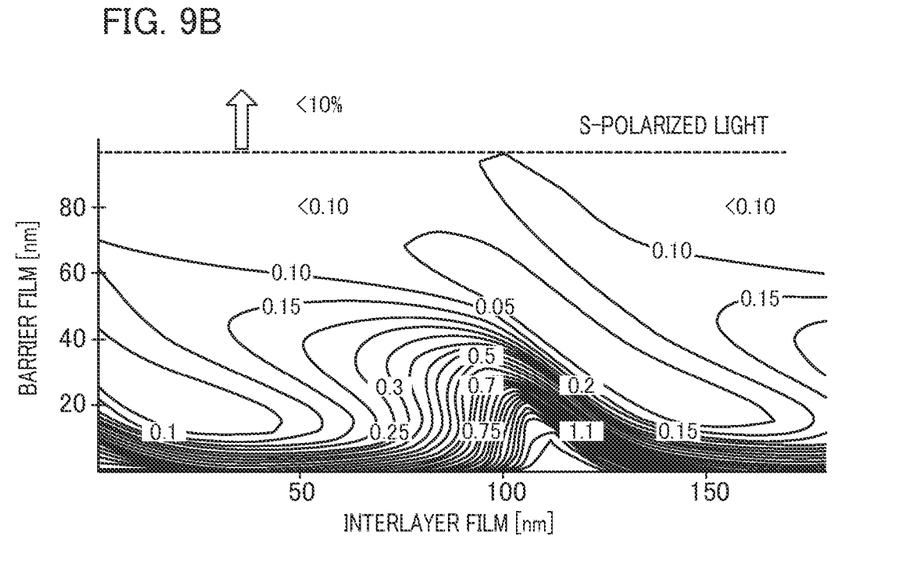
FIG. 9B is a contour map illustrating the calculation result of the reflectance of S-polarized light at the angle of incidence of 52°.

Firstly, a description will be given of reflection of exposure light from the lower layer. It is assumed that exposure light is reflected from a barrier film and a SW to a resist. Firstly, for the reflection of exposure light from she barrier film, an anti-reflective function obtained when SiON is used as material of the barrier film is considered. Note that SiON has a refractive index (complex refractive index) of 1.90-0.51i. Although diffracted light contributing to patterning has various angles of incidence, the angle of incidence which is determined by the NA of an exposure apparatus becomes maximum. For example, when NA is 1.35, the angle of incidence in the resist is 52°. Thus, here, reflectance of diffracted light at the minimum angle of incidence of 0° (vertical) and reflectance of diffracted light at the maximum angle of incidence of 52° are calculated as representative examples. FIG. 7 is a schematic cross-sectional view illustrating a structure to be applied for the calculation of reflectance in this case. The copper wire structure is a multilayered structure, and the configuration of lower layers may change depending on the degree of multilayer property. Here, an underlying layer (Si layer), an interlayer film, and a barrier film are the configuration of lower layers prior to a metal step. Since the lowest layer has a small influence on reflection, the following results show little difference even when the underlying layer is represented by a Si layer. A resist, water used upon liquid immersion exposure, and a lens of a projection optical system constituting an exposure apparatus are present on the barrier film. FIG. 8 is a contour map illustrating the calculation result of reflectance at the angle of incidence of 0° when the film thickness of the interlayer film and the film thickness of the barrier film are variables. With reference to FIG. 8, when the thickness of the barrier film is set to be equal to or greater than 80 nm, the reflectance is 4% or less without dependence on the thickness of the interlayer film which is the underlying layer of the barrier film. FIGS. 9A and 9B are contour maps illustrating the calculation result of reflectance at the angle of incidence of 52° when the film thickness of the interlayer film and the film thickness of the barrier film are variables. In particular, FIG. 9A is a contour map illustrating the calculation result of the reflectance of P-polarized light at the angle of incidence of 52° and FIG. 9B is a contour map illustrating the calculation result of the reflectance of S-polarized light at the angle of incidence of 52°. With reference to FIGS. 9A and 9B for comparison, the reflectance of S-polarized light is higher than that of P-polarized light. However, when the thickness of the barrier film is set to be equal to or greater than 100 nm, the reflectance is 10% or less without dependence on the thickness of the interlayer film which is the underlying layer of the barrier film. While the reflectance increases with increase in the angle of incidence, the reflectance of 10% or less is within an allowable range to exhibit sufficient transfer performance in transfer of the transfer pattern by an exposure apparatus.

Figure 10:
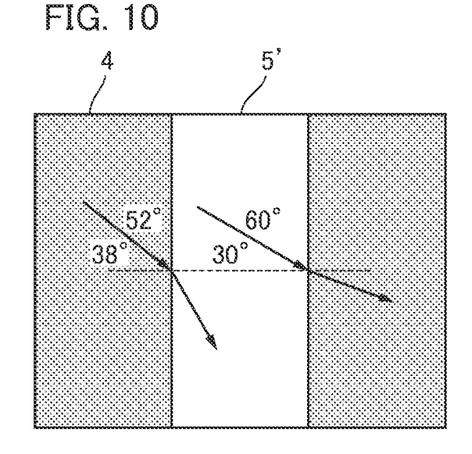
FIG. 10 is a diagram illustrating a state of transmission of light between a resist and a SW.
Figure 11A:
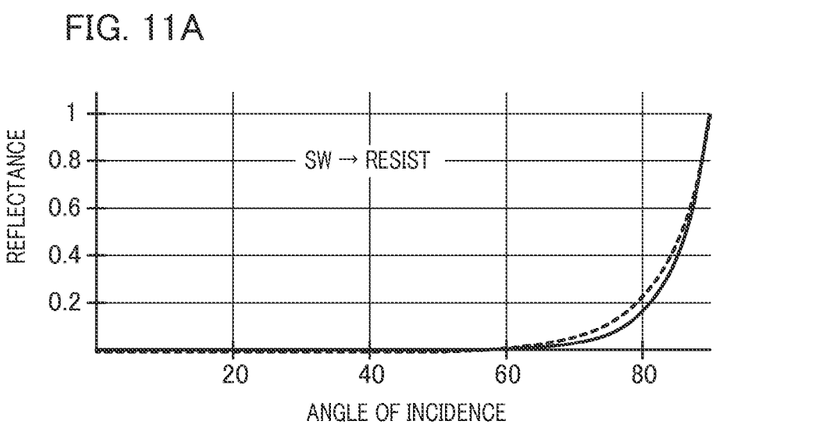
FIG. 11A is a graph illustrating the relationship between the angle of incidence and reflectance of light directed from the SW toward the resist.
Figure 11B:
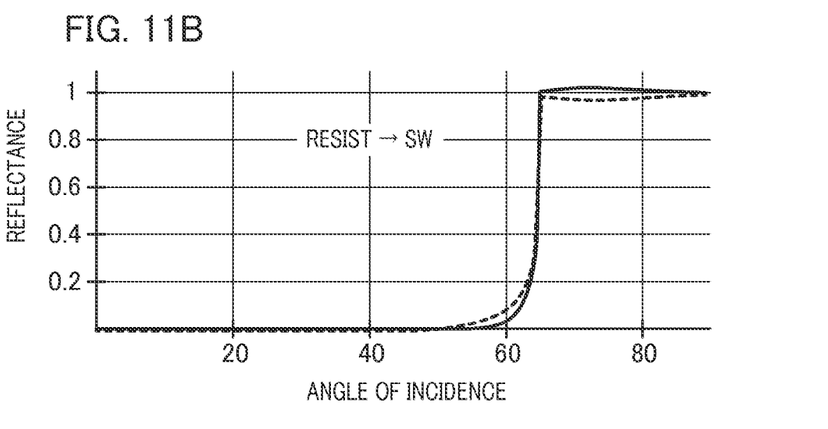
FIG. 11B is a graph illustrating the relationship between the angle of incidence and reflectance of light directed from the resist toward the SW.

Next, for SW reflection, exposure light passes through the alternating structure of a resist and a SW. FIG. 10 is a schematic cross-sectional view illustrating a state of transmission of exposure light directed from the SW 5' to the resist 4 and exposure light directed from the resist 4 to the SW 5' at the maximum angle of incidence. Since the maximum NA is 1.35, the refractive index of the SW 5' (oxide film) is 1.56, and the refractive index of the resist 4 is 1.72-0.02i, the angle of light directed from the resist 4 to the SW 5' shown in FIG. 10 and the angle of light directed from the SW 5' to the resist 4 shown in FIG. 10 are 52° and 60°, respectively, from the relationship of (refractive index)/sin θ=1.35. Here, the angles of reflection/refraction will be considered herein. Since the direction of exposure light upon SW reflection is different by 90° from the direction of exposure light reflected from the barrier film 3, the angle of incidence is represented by 90°−θ, so that the angles of incidence of exposure light directed from the resist 4 to the SW 5' and exposure light directed from the SW 5' to the resist 4 are 38° and 30°, respectively. FIGS. 11A and 11B are graphs illustrating the relationship between the angle of incidence and reflectance of light in this case. In particular, FIG. 11A is a graph illustrating the relationship between the angle of incidence and reflectance of light directed from the SW 5' to the resist 4 and FIG. 11B is a graph illustrating the relationship between the angle of incidence and reflectance of light directed from she resist 4 to the SW 5'. With reference to FIGS. 11A and 11B, the reflectances in both cases are substantially zero at the angles of incidence of 38° and 30°. In contrast, the reflectance of exposure light increases at the angle of incidence of about 80° in FIG. 11A and at the angle of incidence of about 60° in FIG. 11B. However, although such light exists for imaging by an exposure apparatus, the angle of incidence of diffracted light emitted from a projection lens of a projection optical system on the surface of the resist 4 is large in a micro pattern. In other words, the angle of incidence, of which the direction is rotated by 90°, to be considered herein is small. Consequently, light which is important for imaging is scarcely reflected from the layer consisting of the resist 4 and the SW 5', whereas a portion of light which does not materially contribute to imaging travels a complex path but the reflection of such light from the SW 5' can almost be ignored. In other words, light is deflected by refraction but the angle of such light in the resist 4 is finally determined only by the refractive index of the material constituting the resist 4. Thus, imaging is performed at the angle of diffracted light which is determined by a pattern.

On the other hand, in the present embodiment, the surface height of the resist 8 is substantially the same as that of the SW 5' (see FIG. 4B) after the resist etching-back treatment described above, and thus, patterning defocus is reduced without the presence of BARC.

Figure 12A:
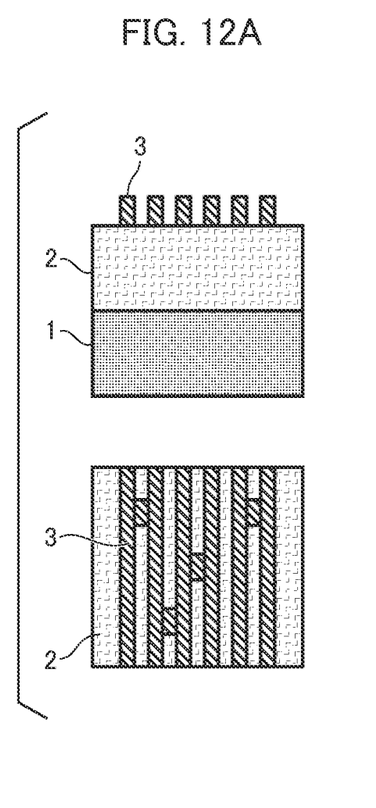
FIG. 12A is a diagram illustrating steps of forming a pattern on a barrier film.
Figure 12B:
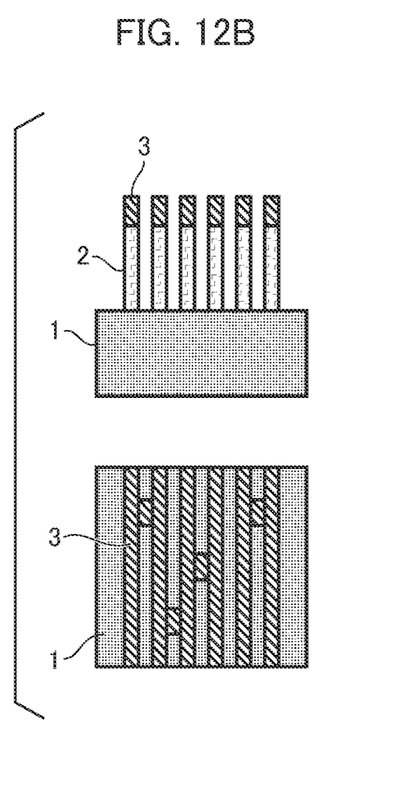
FIG. 12B is a diagram illustrating steps of forming a pattern on an interlayer film.

FIGS. 12A and 12B are schematic cross-sectional views illustrating steps of forming a pattern on the barrier film 3 and steps of forming a pattern on the interlayer film 2, respectively, in a time-series manner in the resist pattern forming method according to the present embodiment. Firstly, as shown in FIG. 12A, a combined pattern of the L/S pattern and the cut pattern is formed in the barrier film 3 by barrier film anisotropic etching using the resist pattern (the resist 8) and the SW 5', which are formed through the step shown in FIG. 6B, as a mask. Then, as shown in FIG. 12B, a desired pattern is finally formed in the inter layer film 2 by inter layer film anisotropic etching using the barrier film pattern as a mask.

As described above, while a resist is embedded in a hole-shaped pattern in the conventional resist pattern forming method, in the present embodiment, a resist is embedded in all of the L/S space portions, and then, the layer consisting of the resist and the SW is exposed. In this manner, the resist pattern to be formed is not a simple remaining pattern but a pattern in which a resist is supported by SW. Thus, even when the pattern aspect ratio exceeds 1 due to the limitations of the pattern size and the thickness of the resist film and the installation area (formation area) is narrower than the conventional pattern, the formed resist pattern may be suppressed from being peeled off as much as possible upon development. In the resist pattern forming method according to the present embodiment, no BARC is used but the same effect as that of BARC can be obtained by bringing the refractive index of the resist close so that of the SW and imparting an anti-reflective function to the barrier film by adjusting she film thickness of the barrier film on the interlayer film in the metal step.

As described above, according to the present embodiment, a resist pattern forming method that is advantageous for suppressing the resist pattern from being peeled off upon forming, for example, a pattern according to the 1D layout may be provided.

Figure 13A:
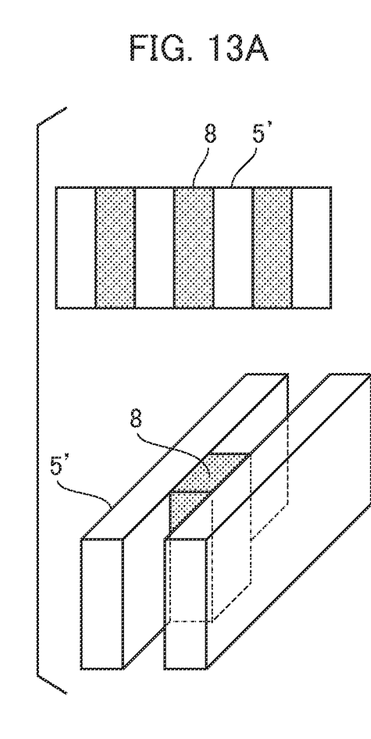
FIG. 13A is a diagram illustrating the embedded state of the resist after the resist etching-back treatment when the height of the resist is the same as that of the SW.
Figure 13B:
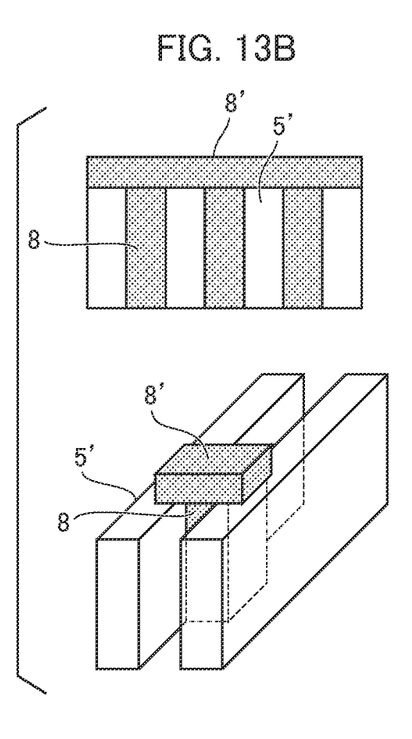
FIG. 13B is a diagram illustrating the embedded state of the resist after the resist etching-back treatment when the height of the resist is higher than that of the SW.
Figure 13C:
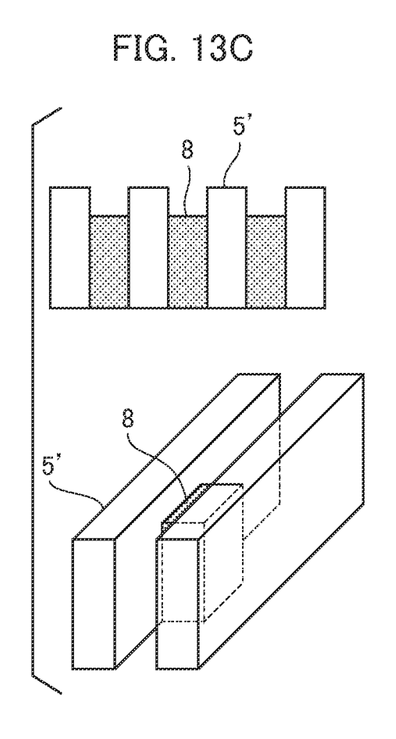
FIG. 13C is a diagram illustrating the embedded state of the resist after the resist etching-back treatment when the height of the resist is lower than that of the SW.

In the step of flattening the resist 8 shown in FIG. 4B, the height (film thickness) of the resist 8 subjected to etching-back treatment is ideally the same as that of the SW 5'. However, since an error may occur in the amount of etching-back by any etching-back technique, the height of the resist 3 may strictly be higher or lower than that of the SW 5'. FIGS. 13A to 13C are schematic views (cross-sectional views and perspective views) illustrating this state. In particular, for reference, FIG. 13A shows a case where the height of the resist 8 is the same as that of the SW 5'. FIG. 13B shows a case where the height of the resist 8 is higher than that of the SW 5', and FIG. 13C shows a case where the height of the resist 8 is lower than that of the SW 5'. Firstly, when the height of the resist 8 is higher than that of the SW 5' as shown in FIG. 13B, the width of the resist 8 sandwiched between the SWs 5' is the same as that of the SW 5' but the resist pattern 8' which extends over the upper portion of the SW 5' and is determined by a mask pattern is formed on the upper portion of the resist 8. If the amount of extension is excessive, the resist 8 may be peeled off. However, in the present embodiment, the resist 8 is subject to etching-back treatment, and thus, a resist portion at the top of the SW 5', which may affect on the peeling off of the resist 8, is much less than that in the conventional forming method, so that the resist 8 can be suppressed from being peeled off as much as possible. On the other hand, when the height of the resist 8 is lower than that of the SW 5' as shown in FIG. 13C, the entire resist 8 is sandwiched between the SWs 5' in the same manner as in the case where the height of the resist 8 is the same as that of the SW 5', resulting in low probability of peeling off of the resist 8. Apart from this, when the height of the resist 8 is lower than that of the SW 5', it is important that the resist 8 has a height sufficient to function as an etching mask. In general, the height of the SW 5' is set to a film thickness sufficient to induce the etching of the barrier film 3, so that the height of the resist 8, which is determined by the height of the SW 5', has also sufficient etching resistance. Thus, even when a certain excessive etching-back treatment is performed in consideration of the current height of the resist 8, no particular effect is provided.

(Article Manufacturing Method)

A method for manufacturing a device (semiconductor integrated circuit element, liquid crystal display element, or the like) as an article or an intermediate product as an article which may be configured as a device includes a step of forming a pattern onto a substrate (wafer, glass plate, or the like) using the aforementioned pattern forming method. The manufacture method may further include a step of etching a substrate on which the pattern has been formed. When other articles such as patterned media (recording media), optical elements, and the like are manufactured, the manufacture method may include other steps of processing a substrate on which a pattern has been formed instead of the etching step. The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-003292 filed on Jan. 11, 2013, which is hereby incorporated by reference herein in its entirety.

What is claimed is:

1. A method for forming a pattern in a layer on a substrate, the method comprising:
   forming a line-and-space pattern including lines extended in one direction above the layer;
   coating a resist on the line-and-space pattern and filling the resist in a space portion of the line-and-space pattern;
   exposing a pattern element having a dimension in the one direction smaller than a dimension of the lines in the one direction to the resist;
   developing away the exposed resist to form a resist pattern according to the pattern element in the space portion, the resist pattern contacting lines of the line-and-space pattern arranged on both sides of the resist pattern; and
   forming a pattern in the layer using a combination of lines of the line-and-space pattern and the resist pattern as a mask.

2. The pattern forming method according to claim 1, further comprising:
   flattening the coated resist after coating the resist on the line-and-space pattern and filling the resist in the space portion of the line-and-space pattern.

3. The pattern forming method according to claim 2, wherein the coated resist is flattened by performing etching-back treatment.

4. The pattern forming method according to claim 1, wherein the line-and-space pattern is a pattern in which a plurality of linear lines is arranged side by side.

5. The pattern forming method according to claim 1, wherein the height of the resist filled in the space portion is equal to or less than the height of the line of the line-and-space pattern.

6. The pattern forming method according to claim 1, wherein the thickness of the layer in which the pattern is to be formed is set on the basis of a light reflectance of an underlying layer of the layer.

7. A method for manufacturing an article, the method comprising:
   forming a pattern on a substrate using the pattern forming method according to claim 1; and
   processing the substrate, on which the pattern has been formed, to manufacture the article.

8. The pattern forming method according to claim 1, wherein a dimension of the pattern element in a direction perpendicular to the one direction is equal to or greater than a dimension of the space portion in the direction perpendicular to the one direction.

9. The pattern forming method according to claim 1, wherein in the exposing step, a plurality of the pattern elements are exposed to the resist and the exposed resist is developed to form the resist pattern of the plurality of the pattern elements in the part of the space portion between the lines.

* * * * *